United States Patent [19]

Osterwald et al.

[11] Patent Number: 4,712,063
[45] Date of Patent: Dec. 8, 1987

[54] METHOD AND APPARATUS FOR MEASURING AREAS OF PHOTOELECTRIC CELLS AND PHOTOELECTRIC CELL PERFORMANCE PARAMETERS

[75] Inventors: Carl R. Osterwald, Lakewood; Keith A. Emery, Fort Collins, both of Colo.

[73] Assignee: The United States of America as represented by the United States Department of Energy, Washington, D.C.

[21] Appl. No.: 614,506

[22] Filed: May 29, 1984

[51] Int. Cl.[4] .......................... G01R 31/26; H01J 3/14
[52] U.S. Cl. ............................ 324/158 D; 324/158 R; 250/341; 250/234
[58] Field of Search ..................... 324/158 R, 158 D; 250/341, 234; 33/1 M; 136/290; 356/237

[56] References Cited

U.S. PATENT DOCUMENTS

| | | | |
|---|---|---|---|
| 3,437,929 | 4/1969 | Glenn | 324/158 P |
| 4,051,437 | 9/1977 | Lile et al. | 324/158 R |
| 4,254,552 | 3/1981 | Samis | 33/1 M |
| 4,455,485 | 6/1984 | Hosaka et al. | 250/234 |

OTHER PUBLICATIONS

Gauthier et al; "Solar Cell Defect Analyzer"; NASA Tech. Briefs; Fall 1979; pp. 398–399.

*Primary Examiner*—Reinhard J. Eisenzopf
*Assistant Examiner*—Vinh P. Nguyen
*Attorney, Agent, or Firm*—Kenneth L. Richardson; John M. Albrecht; Judson R. Hightower

[57] ABSTRACT

A laser scanning system for scanning the surface of a photovoltaic cell in a precise, stepped raster pattern includes electric current detecting and measuring equipment for sensing the current response of the scanned cell to the laser beam at each stepped irradiated spot or pixel on the cell surface. A computer is used to control and monitor the raster position of the laser scan as well as monitoring the corresponding current responses, storing this data, operating on it, and for feeding the data to a graphic plotter for producing a visual, color-coded image of the current response of the cell to the laser scan. A translation platform driven by stepper motors in precise X and Y distances holds and rasters the cell being scanned under a stationary spot-focused laser beam.

18 Claims, 5 Drawing Figures

METHOD AND APPARATUS FOR MEASURING AREAS OF PHOTOELECTRIC CELLS AND PHOTOELECTRIC CELL PERFORMANCE PARAMETERS

CONTRACTUAL ORIGIN OF THE INVENTION

The U.S. Government has rights in this invention under Contract No. De-AC02-83CH10093 between the U.S. Department of Energy and the Midwest Research Institute.

BACKGROUND OF THE INVENTION

1. Field of the Invention

This invention relates to a method and apparatus for accurately measuring areas of photoelectric cells and photoelectric cell performance parameters, and more specifically, for determining and measuring an effective electric current-producing surface areas of solar cells, and how much current is produced in these areas, as well as creating visual and numeric representations of an efficiency of solar cells.

2. Description of the Prior Art

It is often desirable or necessary to determine and evaluate electric current produced by photoelectric cells, such as photovoltaic devices or solar cells, as well as the energy or power conversion efficiencies of the solar cells in order to specify solar cell performance, evaluate quality, or classify them for scientific, engineering, or economic feasibilities. One performance parameter or variable utilized to specify energy conversion efficiency is the electric response in terms of current produced per unit of area of the solar cell. This particular parameter is often measured as current density which can be defined as the total short circuit current $J_{sc}$ (zero load resistance) divided by a cross-sectional area perpendicular to the direction of the current. To accurately quantify the current density, it is necessary to determine and measure the exact surface area of the cell.

Prior to this invention it was often very difficult, if not impossible, to determine the exact surface area of some solar cells for a number of reasons. For example, some solar cells are so small that it is difficult to get sufficiently accurate size measurements of the cells with conventional measuring instruments. Further, and perhaps of more significance, the fabrication of p-n-p or p-i-n junctions in many solar cells dictates using several layers of materials which typically results in such a solar cell base layer that is wider than the layer considered to be the light-absorbing surface.

For example, a common method of fabricating amorphous silicon (a-Si) solar cells is to use stainless steel as a substrate back contact for p-i-n amorphous silicon (a-Si) structure and a transparent conductor, such as indium tin oxide(ITO), to define the cell area. While most of the electric current is produced in the defined cell area, there is also some current collection or production beyond this geometrically defined cell area. Another example of a solar cell in which the effective cell area is not always clearly defined is a common cadmium zinc sulfide/copper indium diselenide structure. The solar cell area of such devices is usually considered to be the top, layer. However, electric current collection from outside the top layer can, and often does, occur if carriers generated in the underlayers can reach the edge or junction.

Consequently, it is frequently very difficult to quantify the exact value of the current density, and thus also specify the exact solar power conversion efficiency of a solar cell with conventional measuring techniques. In this regard, solar cell power conversion efficiency N is often defined as the ratio of the maximum power $P_m$ to the product of imput solar power or radiation intensity I multiplied by the cell area A.

$$N = \frac{P_m}{I \times A} = \frac{J_{sc} \times V_{oc} \times FF}{I \times A} \tag{1}$$

$P_m$ is generally defined as the product of the short circuit current density $J_{sc}$, $V_{oc}$, and FF. $V_{oc}$ is the open circuit voltage of the cell, and FF or fill factor is the ratio of the product of the maximum current $I_m$ and maximum voltage $V_m$ to the product of $V_{oc}$ and $J_{sc}$. $J_{sc}$ is the short circuit current (zero load conditions) of the cell.

All of the performance parameters except for $J_{sc}$ normally can be measured with standard terrestrial photovoltaic measuring equipment available for that purpose independently of cell area. In this regard the power conversion efficiency value N obtained for a given or constant current density $J_{sc}$ and the remaining performance parameters will vary in an inverse proportion to the cell area measurement used in the calculation. Thus, if the area value used in the calculation is smaller than the actual effective light-absorbing area of the solar cell, the conversion efficiency N will appear to be greater. Conversely, use of a smaller area in the calculation will result in a smaller conversion efficiency value. Consequently, any accurate conversion efficiency determination requires an accurate measurement of the cell collector area from which electric current is produced.

At present, the definition of cell area most commonly used by skilled persons working with the testing and evaluation of photoelectric (solar) cells is "the entire front surface area of the cell, including the area covered by grids and contacts." This conventional definition is normally inadequate in measurement procedures such as those discussed above where the geometry of the solar cell device allows electric current collection from an area beyond the portion of the device generally considered to be the light-absorbing cell surface. The conventional definition is also inadequate in the sense that it includes the area covered by conductor grids and contacts within the cell. In reality the latter areas do not function as conversion materials in the cell. Further while using the conventional definition to determine and quantify solar cell efficiency, it typically provides a conversion efficiency value that is averaged over the entire measured area but, it does not usually provide a qualitative analysis or detection of spot impurities or less productive zones within the measured cell area. measured.

SUMMARY OF THE INVENTION

Accordingly, it is an object of the present invention to provide a unique method and apparatus for determining the effective light-absorbing surface area of a solar cell.

It is also an object of the present invention to provide a unique method and apparatus for determining performance parameters useful in specifying substantially exact values of the electrical efficiencies of solar cells.

Another object of the present invention is to provide a method and apparatus for qualitatively testing a solar cell in such a manner as to isolate and identify spot impurities and less productive zones within a solar cell collection area.

This invention includes a method and apparatus for high resolution photo response scanning of photovoltaic or optoelectrical devices such as solar cells. The apparatus is comprised of a laser light source and the optical devices necessary to produce a nondivergent, precisely oriented light beam and focusing it to a diffraction-limited spot on the solar cell. It also includes a translating mounting structure for positioning a solar cell to be tested under the spot-focused laser beam, stepper motors for moving the mounting structure and solar cell in precisely controlled perpendicular X and Y directions in a plane normal to the spot-focused laser beam. An electrometer device is used for sensing the current generated by the solar cell in response to irradiation by the focused laser beam, and a computer is used to control the stepper motors as well as to collect, store, and process the electric current data from the solar cell. A graphic plotter connected to, and controlled by, the computer is provided to produce a visual image of the area and current density zones of the solar cell being tested.

BRIEF DESCRIPTION OF THE DRAWINGS

These and other objects and advantages of the present invention will become more apparent as the detailed description proceeds, taken in conjunction with the following drawings, in which.

DETAILED DESCRIPTION OF THE PREFERRED EMBODIMENT

Figure 1:
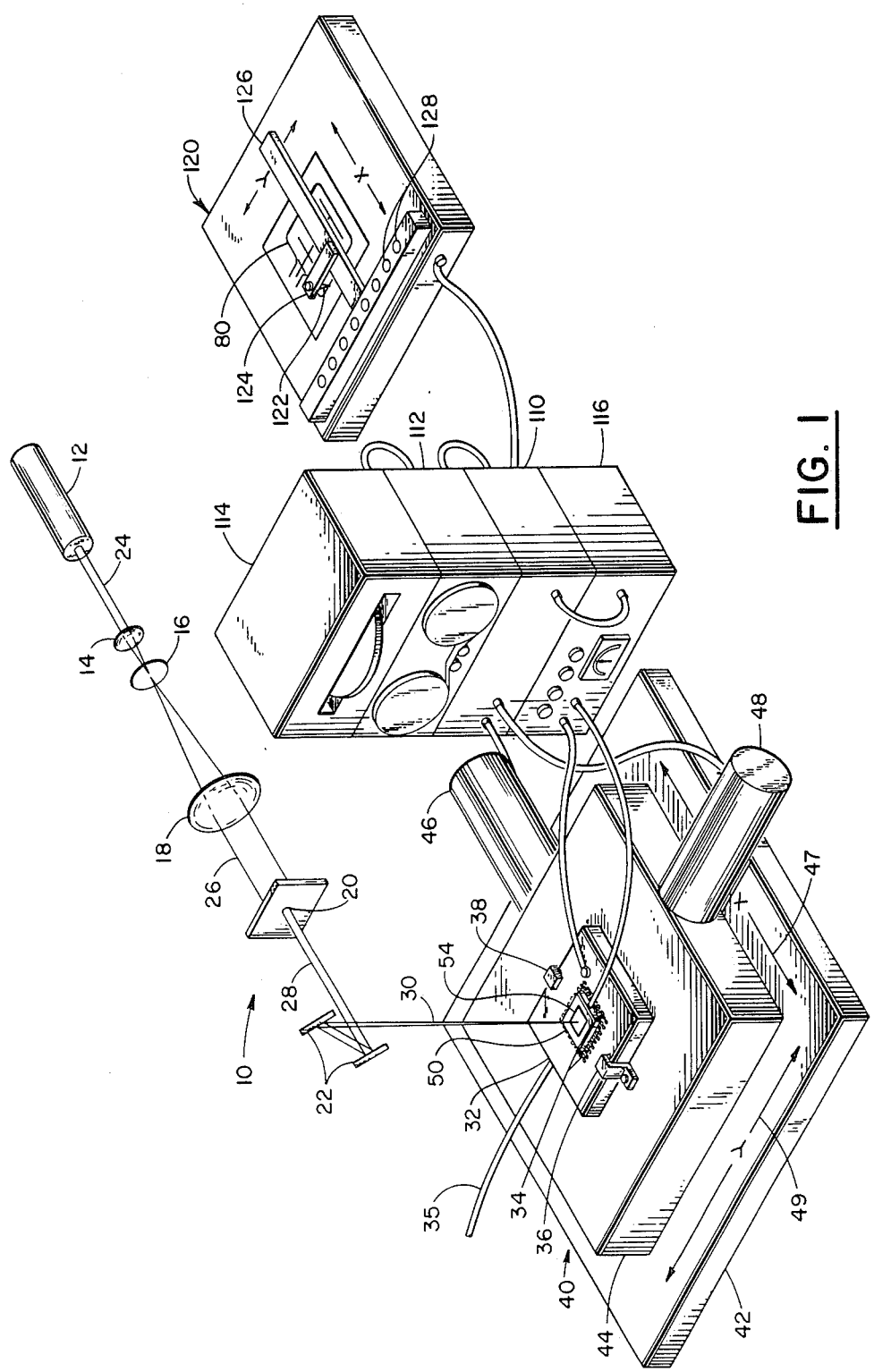
FIG. 1 is a perspective view of the apparatus of which the solar cell testing and measuring device according to this invention is comprised.

The high resolution photo response scanner 10 of the present invention is shown in FIG. 1. It includes a mounting structure 40 for holding a solar cell 50 in position under a spot-focused laser beam 30. Electric current produced by the solar cell 50 in response to the laser beam 30 is measured by an electrometer 116, which feeds this photo response data into a computer 110. The computer, in combination with a tape drive system 112, and/or hard disk drive 114, processes and stores the data generated by the solar cell 50 in response to the laser beam 30. A graphic plotter 120 is connected to and driven by the computer 110 for producing a visual representation of the electric current response of the photo cell 50, as described more completely below.

The translation mounting apparatus 40 is comprised of a stationary base 42 and a slideable translation stage 44 mounted thereon. This translation state 44 is capable of movement in relation to the base 42 in either the X direction indicated by arrow 47 or in the Y direction indicated by arrow 49. This translation apparatus 40 also includes two stepper motors 46, 48 mounted on the base 42 and connected to the translation stage 44. These stepper motors are adapted to move the translation stage 44 in minute, incremental distances in response to input signals from the computer 110. The stepper motor 46 is adapted to move the translation stage 44 in incremental distances in the X direction, and the stepper motor 48 is adapted to move the translation stage 44 in incremental distances in the Y direction. For example, the stepper motor 46 will move the translation stage 44 an increment of 40 micrometers in response to a pulse generated by the computer 110. Once this movement is accomplished, the stepper motor stops, and the translation stage 44 remains in stationary position in relation to the base 42 until an additional signal is received from the computer 110 to translate the stage 44 an additional increment. The stepper motor 48 operates in a similar manner to move the stage 44 in incremental steps in the Y direction.

A vacuum hold-down device 32 is retained in position on the top surface of the translation stage 44 by a set of brackets 36, 38. This hold down device 32 has a hollow interior connected to a vacuum hose 35. A plurality of small holes 34 extend from the upper surface of the hold-down device 32 into the interior thereof in such a manner that a vacuum drawn on the hose 35 causes a downwardly directed suction through the holes 34. A test solar cell 50 is positioned on the upper surface of the hold-down device 32, and the vacuum drawn through the holes 34 hold the solar cell 50 securely in position on the hold-down device 32. In this manner, the solar cell 50 is moved in small incremental steps in either the X or Y direction by stepper motors 46, 48 as controlled by the computer 110. The solar collector 50 is electrically connected to an electrometer device 116. In this manner, the electrometer detects the intensity of concentration of electrical current produced by the solar cell 50, i.e., the current response at any particular time, and the electrometer feeds this data into the computer 110.

A laser beam 30 is focused to a narrow spot on the surface on the solar cell 50. It is preferred, for purposes of accuracy and high resolution, that the laser beam 30 be oriented normal to the plane of the surface of solar cell 50. In this manner, the beam 30 is held stationary while the solar cell 50 can be moved or rastered to various positions under the beam 30, as described in more detail below.

A precise, diffraction-limited, spot-focused laser beam 30 can be provided for purposes of this invention by the optical instruments shown in FIG. 1. This optical arrangement is comprised of a helium-neon (He-Ne) laser light source 12 that produces a coherent laser beam 24 of 6328 Å wavelength. The laser beam 24 is focused by a lens 14 to a spatial filter 16, which blocks substantially all divergent light beams, thus providing a precisely oriented laser beam. This beam then passes through a collimator lens system 18, which upon exit, presents a precisely aligned, parallel beam 26 to an aperture-limiting lens system 20. The aperture-limiting lens system 20 narrows the diameter of the beam. This narrow beam 28 is then passed through an off-axis focusing system 22, which focuses the coherent beam 30 to a diffraction-limited spot on the surface of the solar cell 50.

Figure 2:
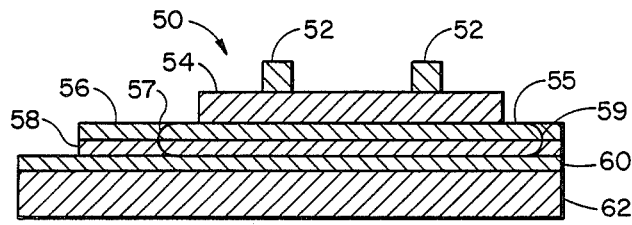
FIG. 2 is a cross-sectional view of a typical cadmium zinc sulfide/copper indium diselenide solar cell, which is typical of the devices contemplated for testing according to this invention.

For the purposes of this description, a typical solar cell 50 is shown in cross section in FIG. 2. This partiuclar cell is comprised of aluminum conductors 52 positioned on a layer of cadmium zinc sulfide Cd(Zn)s, 54. Under the cadmium zinc sulfide layer is a layer 54 of high resistivity copper indium diselenide ($CuInSe_2$) 56 underlaid by a layer of low resistivity copper indium selenium ($CuInSe_2$) 58. The copper indium diselenide bases 56, 58 are positioned on a molybdenum (Mo) layer 60, which overlays a base 62 of aluminum oxide ($AL_2O_3$).

In such a solar cell 50, as illustrated in FIG. 2 and described above, the surface area of the cadmium zinc sulfide, Cd(Zn)S, layer 54 is generally considered to be the light absorbing cell surface. It is on this layer 54 that most of the electric current is generated by the impingement of solar radiation. Such electric current generated by a cell in response to irradiation is known as current response or photo response or photoelectric response.

In a conventional energy conversion efficiency measuring system, the surface area utilized in the efficiency calculations would be the surface area of this layer 54, including the area of the conductors 52. However, current collection from outside the top Cn(Zn)S layer 54 can occur if current carriers generated in the $CuInSe_2$ layers 56, 58 reach the Cd(Zn)S edge. This invention shows that light impinging on the high resistivity $CuInSe_2$ layer 56 within a fringe area 55 also produces some electric current. This fringe area 55 is approximately between boundaries 57, 59 a spaced distance outwardly of the lateral edges of the top Cd(Zn)S layer 54. Consequently, if the total current produced by the cell is used in conjunction with only the surface area of the upper Cd(Zn)S layer 54 to calculate the conversion efficiency of this solar cell, the efficiency value will very likely be somewhat higher than its actual efficiency. A significant feature of this invention is its ability to detect and quantify in numerical, as well as visual, terms the actual electric current production in the fringe areas 55, as well as on the Cd(Zn)S layer 54.

A significant concept of this invention is to scan the entire surface area of the solar cell 50, including the surface of the top Cd(Zn)S layer 54, as well as the surrounding surface of the underlying $CuInSe_2$ layers with a spot-focused laser beam and to measure and record the electric current produced by the solar cell, i.e., current response, from the spot-focused laser beam as it impinges on individual parts of the surface of the solar cell 50. In order to do so, the solar cell 50 is moved by the translation stage 44 in step increments in such a manner that the laser beam 50 rasters across the entire surface area of the solar cell 50.

This rastering laser scan of the surface of the solar cell 50 is best described by reference to FIG. 3 which is an enlarged view of a segment of the surface of the solar cell 50 with a raster pattern 70 illustrated thereon. For purposes of this description, the surface of the solar cell 50 can be considered to be divided into a plurality of adjacent square sections or pixel areas 64. The size of these pixels 64 are defined by the incremental travel distance of the translation stage 44 as moved by the stepper motors 46, 48 in response to one move signal generated by the computer 110. It is preferred that the size of each square section or pixel 64 is approximately equal to the diameter of the spot-focused laser beam 30 on the surface of the solar cell 50.

Figure 3:
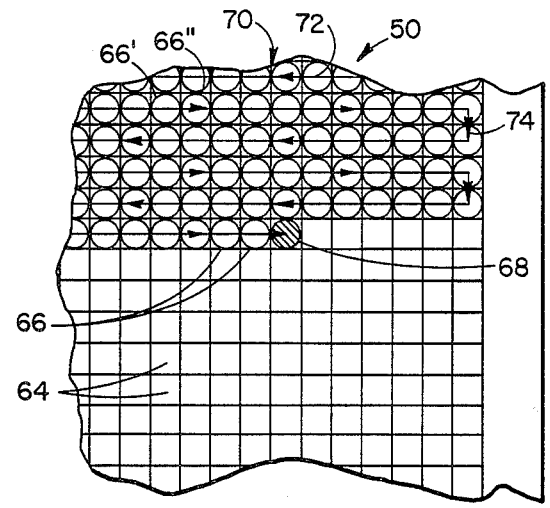
FIG. 3 is an enlarged partial view of the raster laser scanning pattern over the test solar cell according to this invention.

As shown in FIG. 3, each of the circles 66 represents an area that was irradiated by the spot-focused laser beam 30 during the rastering scan. The translating stage 44 was held stationary for a very short increment of time while the beam 30 was irradiating each of these areas 66, during which time an electrical output reading, i.e., measurement of the current response, from the solar cell 50 was taken by the electrometer 116. For example, when the laser beam 30 was irradiating the area 66' on the surface of solar cell 50, the translation stage 44 was stationary, and an electrical current output, i.e., current response, from the solar cell 50 was detected and read by the electrometer 116. The value of that electrical current reading, i.e., measurement of current response was fed by the electrometer 116 into correlating means in the form of the computer 110 for processing and storage on either the tape drive 112 or hard disk drive 114. Then, the computer 110 output or generated a signal to the stepper motor 46 to move the translation stage 44 one incremental distance or pixel 64 in the X direction, as illustrated by the arrow 72. At that point, the translating stage 44 stopped, and the laser 30 irradiated the area 66". While the translation stage 44 was in that stationary position, the electrometer 116 detected and read the electric current output, i.e., current response, of the solar cell 50 resulting from the irradiated area 66". That value is also fed by the electrometer 116 into the correlating means or computer 110 for processing and storage on the tape drive 112 or hard disk drive 114.

This incremental step scanning and electic current output reading process was continued across the entire surface of the solar cell 50 in a raster pattern 70. When the laser scan reaches the outer limits of the predetermined scan area or size, the computer 110 outputs or generates a signal to the stepper motor 48 to move the translation stage 44 one incremental step or pixel 64 in the Y direction as illustrated by the arrow 74. Then, the sequential current reading, pixel step movement, and current response reading again continues in a rastering pattern 70 over the entire surface of the solar cell 50.

In the rastering pattern illustrated in FIG. 3, the uncrosshatched circles 66 indicate areas which have been irradiated by the laser beam 30 with a corresponding electrical current output or response of the solar cell 50 having been read or measured by the electrometer 116. The crosshatched circle 68 illustrates what could be considered the present irradiated area in the raster pattern, which will continue into the unirradiated pixels or square sections 64 until the entire surface of the solar cell 50 has been scanned and electric current response readings taken and stored for each pixel 64. This step scanning or rastering process is particularly conducive to storage or data on tape or disk relating to the pixels and current responses of each in digital format for late recall and use. The incremental step movements can be counted by step motor signals from the computer. Then, as the translation stage 44 is stationary and a current response reading or measurement is taken, the current response measurement or data can be processed through an analog to digital converter to put the current response in digital format for storing with the digital step position or raster position data for that current response by a computer or correlation means. In other words, each measurement of current response from each pixel is correlated, i.e., put together in mutual relation, with the information or data designating the geometric position of the specific pixel from which each such current response is produced.

The electrometer readings then are transferred to a data processing unit or computer means along with the information regarding the precise location of the solar cell in relation to the focused beam. This information is processed by the unit or computer to provide a complete profile of the response of the cell to the laser beam. The computer thereafter passes the processed information to the storage devices for later analysis and to a graphic plotter device for plotting the response of the solar cell. The response of the cell plotted against the location of the laser beam on the cell surface can be used to accurately plot the surface area of the solar cell leading to a more precise calculation of actual solar cell area efficiency.

As mentioned above, it is preferred that each pixel or square section 64 is dimensioned to enclose the approximate irradiated area 66. However, an example test run according to this invention has been successful using a 40-micrometer pixel or square section 64 size, wih the spot-focused laser beam 30 irradiating a circular area of approximately 25-micrometers diameter within each square section 64. The test results obtained in such manner have been quite successful and very useful.

Once the entire surface area of the solar cell 50 has been scanned as described above, the electrical output data for each pixel 64 stored in the tape drive 112 or disk drive 114 can be processed and displayed in a variety of very useful formats. For example, the areas of all of the pixels 64 in which irradiation areas 66 produced electric current responses can be totalled to provide an accurate figure representing the total electrical current-producing area of a solar cell, including the fringe areas. Even more beneficial, however, is the ability to categorize the pixels 64 in groups that produced electric current outputs or responses within preselected ranges. In this manner, the computer 110 can, for example, add all of the pixels 64 in the group which produced some minimal amount of electricity to indicate the area of an outer fringe. It can also add up the total pixels 64 in a group that produced medium electrical outputs. Of course, it can also total all of the areas of the pixels 64 in the group that produced very high amounts of electric current. In this manner, one can select the particular area categories for which one desires to calculate conversion efficiency of the solar cell more knowledgeably and in a more useful manner than previously possible.

One of the most useful features of this invention, however, is the production of a visual image of the areas of various preselected electrical output categories by the use of a precision flat-bed pen graphic plotter 120. Such graphic plotters, as the plotter 120 illustrated in FIG. 1, are commercially available. For purposes of understanding this invention, however, a simplified explanation of the function of the plotter 120 is helpful. It includes a translating arm 126 movable in the Y direction with a pen holder 124 mounted thereon and movable in the X direction. The pen holder 124 holds a stylus or pen 122 having one particular color of ink. Pens 128 having additional colors are stored alongside the plotter 120. The pen holder 124, controlled by the computer 110, has the capability of releasing the pen 122 in a storage position and picking up any one of the other pens 128 having different ink colors. Therefore, this computer-controlled plotter 120 can be used to draw a visual image 80 or the current-producing areas of the solar cell 50, with each group of pixels 64 categorized by the magnitude of current they produced during the scan, represented in different colors.

Figure 4:
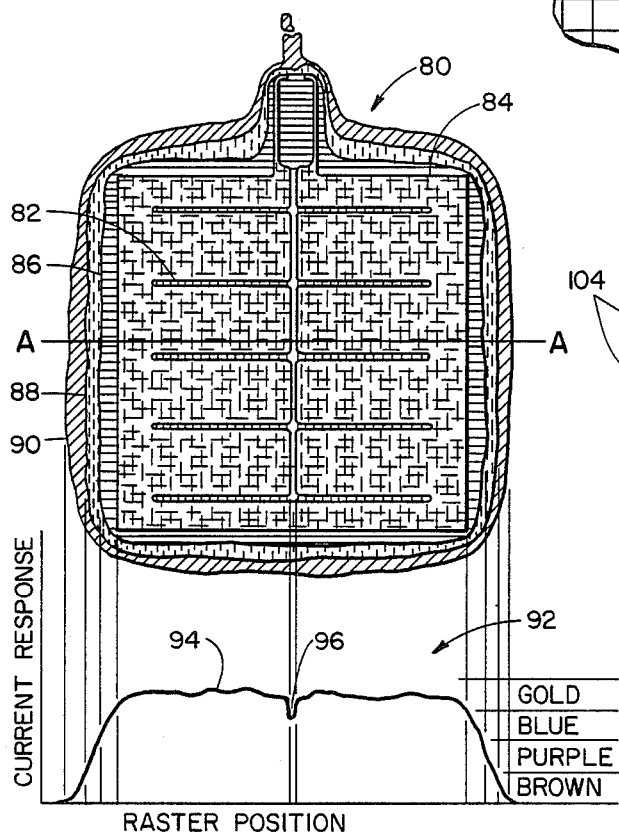
FIG. 4 is a combination view of a visual image of the current-producing areas of a solar cell tested according to the present invention in combination with a graphical representation of the current response as a function of raster position and the color code increments utilized in production of the visual image.

An example of such a visual image 80 of a solar cell 50 produced by the graphic plotter 120 is shown in FIG. 4. Several different colors are used to illustrate preselected groupings of areas that produced certain ranges of electric current when irradiated by the laser beam 30 during the scan. Also illustrated in FIG. 4 for purposes of this description is a graphical plot 92 of current response as a function of raster position across the section A—A. The combination of this graphical representation 92 in the lower portion of FIG. 4 with the visual image 80 in the upper portion of FIG. 4 illustrates the method according to this invention of representing the characteristics of a laser-scanned solar cell. In following the graphical representation across the section A—A from left to right, it is shown that outside the current-producing area of the solar cell there is practically no current production. As the laser beam 30 moved right (or the translation stage 44 moved left), the solar cell began to produce current, as shown by the rising altitude of the line 94 of graph 92. The current-producing capability of the cell continued to increase in the fringe areas 55 of the cell until the laser beam 30 irradiated the actual collector surface of the Cd(Zn)S layer 54. This Cd(Zn)S layer 54 is, of course, the principle current-producing area of the solar cell 50 as illustrated by the graph 92. Then, as the laser 30 moved off the right side of the Cd(Zn)S layer 54, the fringe area 55 of decreasing current producing capability is shown on the right side of the graph 92.

It is convenient and meaningful for purposes of grouping to represent the current response scaling of the pixels 64 in a logarithmic relationship as follows:

$$\Delta (\log I_{th}) = \frac{\log I_{MAX} - \log I_{MIN}}{N} \quad (2)$$

where $I_{MAX}$ and $I_{MIN}$ are the maximum current and minimum current, respectively. The computer is programmed to group the current response values in a number of individual ranges. For the purposes of graphical plotting, each current response range is assigned a color. In the illustration of FIG. 4, four ranges were selected with the color gold assigned to the maximum current-producing range, and blue, purple, and brown assigned to the lower ranges in respective descending order. In the relationship of equation (2), $\Delta(\log I_{th})$ is the incremental threshold for differentiating between the color ranges, and N is the number of separate colors used in the plot (including no color for the lowest response).

Therefore, as shown in FIG. 4, the highest current-producing range of the solar cell 50 is shown by the gold area 84. This gold area corresponds precisely with the surface area of the cadmium zinc sulfide, Cd(Zn)S, collector layer 54 of the solar cell 50. The blue area 86 illustrates the fringe area of the copper indium diselenide, $CuInSe_2$, of somewhat lower current-producing ability immediately adjacent the edges of the Cd(Zn)S layer 54. In descending order, the purple areas 88 and the brown areas 90 indicate the medium and outer fringe areas of current-producing ability in the $CuInSe_2$ layer 56. The outer perimeter of the brown area 90 corresponds to the outer boundaries 57, 59 in FIG. 2 of the current-producing ability of the CuInSe$_2$ layer 56. It can also be noted, in FIG. 4, that there is a drop in value of current-producing ability at the midpoint 96, which corresponds to the conductor grid 82 in the solar cell.

It can be appreciated that this visual representation of the areas of various ranges of current-producing ability in and around the collector surface of the solar cell 50 can be very useful in analyzing and determining energy conversion efficiency of a solar cell. For example, if one is interested in the conversion efficiency of the exact collector surface defined by the geometry of the upper Cd(Zn)S layer 54 only, this method can be used to isolate only the electrical outputs of that area so that the calculated efficiency numbers are precise and accurate. This kind of selection and accuracy in surface area determinations and conversion efficiency calculations was not possible prior to this invention.

Figure 5:
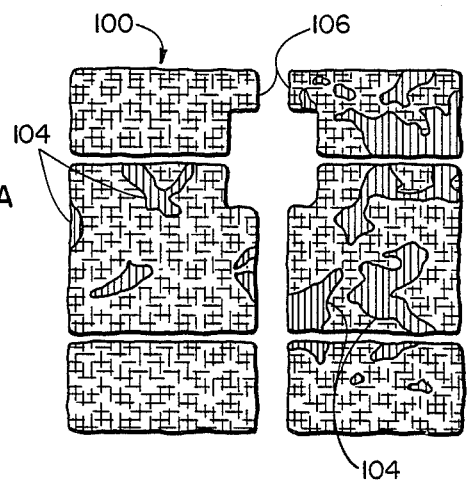
FIG. 5 is another graphically produced visual image of the photovoltaic response of a solar cell showing the noncurrent-producing areas occupied by the grids and conductors within the cell, as well as spot impurities and less productive areas of the solar cell.

Another illustration of a beneficial use of this invention is shown in FIG. 5, which was a scan 100 of a polycrystalline silicon solar cell in which the junction extends over the entire substrate. In this case, the scan 100 shows no collection from outside the cell. Thus, the cell area is accurately defined. Also, clearly visible in this scan 100 are grains 104 of reduced current output and point defects. The noncurrent-producing areas occupied by the grid in conductor paths 106 in the cell are also clearly visible.

The digital laser scan system according to this invention can be used to determine whether extra current collection beyond the area of the conventional solar cell surface is a consideration or an additional parameter in determining conversion efficiency. It can also measure cell area more accurately than the results obtained from conventional optical measurements of the top layer. Further, as shown in FIG. 5, it is clearly capable of showing impurities or defects in the solar cell where current-producing capabilities are reduced. Thus, it can also be used in quality testing and quality control operations in the manufacture of solar cells. This invention can also be used for other related purposes, such as measurement of recombination at grain boundaries in polycrystalline materials, measurement of diffusion lengths, and analysis of the degree of passivation of electrically active recombination sites in photoelectric devices.

Accordingly, the present invention has been described with some degree of particularity directed to the preferred embodiment of the present invention. It should be appreciated, though, that the present invention is defined by the following claims construed in light of the prior art so that modifications or changes may be made to the preferred embodiment of the present invention without departing from the inventive concepts contained herein.

The embodiments of the invention in which an exclusive property or privilege is claimed are defined as follows:

1. Apparatus for mapping and quantifying effective current-producing cell area of a photovoltaic device in response to irradiation of the device, comprising:

translation stage means for supporting the photovoltaic device thereon, said translation stage means including drive means for moving said photovoltaic device intermittently in precisely measured spacial increments in orthogonal directions in response to motion implementing signals;

radiation producing means adjacent said translation stage for producing a coherent beam of radiation in a fixed position directed substantially normal to said translation stage onto said photovoltaic device in a focused incident spot having a precise, unvarying diameter, a precise, unvarying shape, and a precise unvarying intensity on the photovoltaic device;

signal generating means connected to said drive means for producing intermittent motion implementing signals for said drive means to sequentially move said translation stage in uniform precisely spaced discrete increments of distance in selected orthogonal directions not less than the diameter of said incident spot and for stopping the movement after each discrete increment of distance for an increment of time, such that said incident spot is focused sequentially on adjacent discrete areas of uniform size on said photovoltaic device for fixed increments of time;

electronic sensing means for sensing and measuring the magnitude of electric current response produced by said photovoltaic device in response to irradiation of said photovoltaic device by said beam of radiation at each geometric position on said photovoltaic device between incremental movements thereof; and computer means for producing said motion implementing signal, for correlating and storing measured current response along with said respective geometric positions, for sorting into a group specific geometric positions from which current response is measured, utilizing the increments of movement for determining the dimensions and area of each of such geometric positions from which current response is measured, and totalling the areas of such geometric positions to obtain a total area of the photovoltaic device from which current response is produced.

2. The apparatus of claim 1, wherein said drive means includes first stepper motor means connected to said translation stage for moving said photovoltaic device in one X direction and second stepper motor means connected to said translation stage for moving said photovoltaic device in another Y direction that is orthogonal to said X direction, wherein these X and Y direction movements are made in precisely predetermined and controlled sequential linear distance increments.

3. The apparatus of claim 2, wherein said stepper motor means are set and controlled to scan the surface of said photovoltaic device with said radiation beam in small adjacent pixel segments of the area of the photovoltaic device with a preselected pixel segment size just large enough to contain said focused incident spot of said radiation beam.

4. The apparatus of claim 3, including plotting means connected to said computer means for producing a visual image of the current response in each of said pixel segments irradiated.

5. The apparatus of claim 1, wherein said radiation-producing means includes a laser light beam source, spacial filtering means in the path of said laser beam for blocking all divergent, nonparallel light rays, collimating lens means in the path of said spacially filtered means for providing said beam in a precisely aligned, parallel beam, aperture-limiting means positioned in the path of said collimated beam for narrowing the diameter of the beam, and focusing means in the path of said narrowed collimated beam for spot-focusing said beam to a small area on said photovoltaic device.

6. The apparatus of claim 5, wherein said focusing means includes an off-axis focuser that orients said laser beam at an angle that is always orthogonal to the surface plane of the photovoltaic device and focuses the beam to cover an area on the surface of the photovoltaic device to an incident spot having a diameter less than the distance an incremental movement travels.

7. The apparatus of claim 1, wherein said computer means also includes sorting means for sorting and categorizing said measured current responses along with said respective geometric positions into a plurality of groupings based on different magnitude ranges of said measured current responses.

8. The apparatus of claim 7, including display means connected to said computer means for displaying said measured current responses in a composite geometric pattern corresponding to said respective geometric positions.

9. The apparatus of claim 8, wherein said display means has the capability of displaying said measured current responses in such a manner that said respective groupings are visually distinguishable.

10. The apparatus of claim 7, wherein said computer means includes calculating means for adding together the areas of each of said geometric positions in each of said groupings to thereby determine the total geometric area of each of said groupings.

11. Apparatus for mapping and quantifying effective current-producing cell area of photovoltaic and optoelectronic devices in response to irradiation of the devices, comprising:
a laser source for producing a coherent laser beam;
spacial filtering system in the path of said laser beam;
a collimating lens system in the path of said laser beam after said spacial filtering system;
aperture-limiting means in the path of said laser beam after said collimating lens system for reducing the diameter of the precisely oriented and collimated laser beam;
focusing means in the path of said reduced-diameter collimated laser beam for focusing said laser beam to an incident spot of precise, unvarying size, shape, and intensity on the device to be scanned;
a translation stage normal to said focused beam and movable in orthogonal X and Y directions, said translation stage including attachment means for attaching the device to be scanned in a plane normal to the focused beam;
first stepper motor means connected to the translation stage for moving the translation stage in the X direction in relation to the beam in intermittent, uniform, stepwise predetermined discrete increments barely larger than the diameter of said incident spot of laser beam on said device;
second stepper motor means connected to the translation stage for moving the translation stage in the Y direction in relation to the beam in intermittent, uniform, stepwise predetermined discrete increments barely larger than the diameter of said incident spot of laser beam on said device;
electrometer means connected to the device for sensing and measuring current response generated by the device in response to irradiation of the device by the spot-focused laser beam;
computer means connected to said first and second stepper motor means for inducing said incremental movements and to said electrometer means for converting the electrometer value of current response sensed after each increment of movement into digital form for each location on the device where the beam irradiates the surface to produce each such current response, for correlating each of said measured responses together with the X-Y positions where each such response is produced, for sorting the respective geometric positions into a group from which current response of a predetermined magnitude range is measured, for utilizing the increments of movement in the X-Y directions for determining dimensions and area of each such geometric position where current response in the predetermined magnitude range is measured, and for totalling the areas of such geometric positions to obtain a total effective area of the photovoltaic device from which such predetermined current response magnitude is produced.

12. The method of measuring surface area of a photovoltaic cell from which the cell is capable of producing an electric current in response to irradiation, comprising the steps of:
orienting and maintaining a diffusion-limited coherent radiation beam perpendicular to the surface of the cell and focusing the beam to an incident spot of precise, nonvarying size, shape, and intensity on the surface of said cell;
intermittently moving the cell in a plane perpendicular to said radiation beam in sequential, uniform increments of distance in orthogonal X and Y directions in said plane to raster said incident spot in a pattern of adjacent pixel segments, each of which has a geometric spacial position on the surface area of the cell, by selecting said increments of distance to define said pixel segments area just large enough to enclose said incident spot;
sequentially measuring the magnitude of current produced by the cell in response to irradiation by said spot-focused beam on each of said pixel segment areas and retaining each of said current response measurements in correlation with the geometric spacial position of each respective pixel segment area irradiated when each measurement was taken; and totaling selected pixel segment areas where current is produced and measured in response to said spot-focused irradiation.

13. The method of claim 12, including the step of grouping the pixel segment areas in terms of selected ranges of current magnitude produced by said pixel segment areas in response to irradiation by said spot-focused beam.

14. The method of claim 13, including the step of grouping the pixel segment areas by the formula $$\Delta (\log I_{th}) = \frac{\log I_{MAX} - \log I_{MIN}}{N}$$

where $\Delta (\log I_{th})$ is the incremental threshold for each group, $I_{MAX}$ and $I_{MIN}$ are the maximum and minimum currents respectively, over the range to be grouped, and N is the number of groups desired in the range.

15. The method of claim 14, including the step of plotting a visual graphic image of the current producing area of the cell by plotting the individual pixel area segments in which current is produced in precise, undistorted geometric spacial positions corresponding to, and in direct size proportion to, the geometric spacial positions and sizes of the respective current-producing areas of the cell.

16. The method of claim 15, including the step of plotting said visual graphic image with a distinct color for all the pixel segments areas in each of said groups.

17. The method of claim 13, including the step of determining solar power conversion efficiency (N) by:

measuring open circuit voltage ($V_{oc}$) of the cell, fill factor (FF), and intensity (I) independent of cell area;

determining effective cell area (A) by totalling the pixel segment areas of selected current magnitude groups; and calculating solar power conversion efficiency (N) by the formula:

$$N = \frac{P_m}{I \times A} = \frac{J_{sc} \times V_{oc} \times FF}{I \times A}$$

18. The method of claim 12, including the step of focusing the beam to an incident spot having a diameter in the range of about 20 to 30 micrometers and moving said cell in uniform intermittent X and Y distance increments in the range of about 35 to 45 micrometers.

* * * * *